(12) United States Patent
Rusconi Clerici Beltrami et al.

(10) Patent No.: US 11,418,891 B2
(45) Date of Patent: Aug. 16, 2022

(54) LOUDSPEAKER UNIT COMPRISING AN ELECTRODYNAMIC LOUDSPEAKER AND A MEMS LOUDSPEAKER

(71) Applicant: USOUND GmbH, Graz (AT)

(72) Inventors: Andrea Rusconi Clerici Beltrami, Vienna (AT); Ferruccio Bottoni, Graz (AT)

(73) Assignee: USound GmbH, Graz (AT)

( * ) Notice: Subject to any disclaimer, the term of this patent is extended or adjusted under 35 U.S.C. 154(b) by 0 days.

(21) Appl. No.: 16/606,954

(22) PCT Filed: Apr. 19, 2018

(86) PCT No.: PCT/EP2018/060048
§ 371 (c)(1),
(2) Date: Oct. 21, 2019

(87) PCT Pub. No.: WO2018/193038
PCT Pub. Date: Oct. 25, 2018

(65) Prior Publication Data
US 2020/0196067 A1    Jun. 18, 2020

(30) Foreign Application Priority Data
Apr. 21, 2017    (DE) .......................... 102017108594.7

(51) Int. Cl.
*H04R 23/02*    (2006.01)
*B81B 7/02*    (2006.01)
(Continued)

(52) U.S. Cl.
CPC ............... *H04R 23/02* (2013.01); *B81B 7/02* (2013.01); *H04R 1/025* (2013.01); *H04R 1/24* (2013.01); *H04R 7/18* (2013.01); *H04R 9/06* (2013.01); *H04R 17/00* (2013.01); *B81B 2201/0257* (2013.01); *B81B 2203/0127* (2013.01); *H04R 2201/003* (2013.01)

(58) Field of Classification Search
None
See application file for complete search history.

(56) References Cited

U.S. PATENT DOCUMENTS 4,386,241 A * 5/1983 Maeda .................... H04R 17/00
310/324
5,022,488 A * 6/1991 House ...................... H04R 1/26
181/156
(Continued)

FOREIGN PATENT DOCUMENTS

CN    103581808 A    2/2014
CN    204810546 U    11/2015
(Continued)

OTHER PUBLICATIONS

Search Report GPTO, dated Dec. 15, 2017, 8 pages.
(Continued)

*Primary Examiner* — Walter F Briney, III
(74) *Attorney, Agent, or Firm* — Dority & Manning, P.A.

(57) ABSTRACT

A loudspeaker unit for a portable device includes an electrodynamic loudspeaker configured as a woofer. The loudspeaker unit additionally includes a MEMS loudspeaker configured as a tweeter. A portable device includes the loudspeaker unit.

10 Claims, 4 Drawing Sheets

(51) Int. Cl.
*H04R 1/02* (2006.01)
*H04R 1/24* (2006.01)
*H04R 7/18* (2006.01)
*H04R 9/06* (2006.01)
*H04R 17/00* (2006.01)

(56) References Cited

U.S. PATENT DOCUMENTS

| | | | | |
|---|---|---|---|---|
| 5,062,139 | A | * | 10/1991 | Christensen ............ H04R 17/00 381/184 |
| 9,210,489 | B1 | | 12/2015 | Cbu et al. |
| 10,045,136 | B2 | | 8/2018 | Clerici Beltrami et al. |
| 2013/0156253 | A1 | | 6/2013 | Lemarquand et al. |
| 2014/0169593 | A1 | * | 6/2014 | Kwon ..................... H04R 9/043 381/185 |

FOREIGN PATENT DOCUMENTS

| | | |
|---|---|---|
| CN | 106488366 A | 3/2017 |
| DE | 102010004312 | 7/2011 |
| DE | 102015107560 | 11/2016 |
| EP | 1271999 | 1/2003 |
| JP | S6194499 A | 5/1986 |
| JP | 2001238285 | 8/2018 |
| KR | 20070108035 A | 11/2007 |

OTHER PUBLICATIONS

International Search Report, dated Jun. 4, 2018, 11 Pages. (English Translation).
Chinese Office Action dated Oct. 12, 2020, 9 pages.
PCT International Preliminary Report, corresponding to PCT/EP2018/060048, dated Oct. 22, 2019, 9 pages.

* cited by examiner

LOUDSPEAKER UNIT COMPRISING AN ELECTRODYNAMIC LOUDSPEAKER AND A MEMS LOUDSPEAKER

CROSS REFERENCE TO RELATED APPLICATIONS

Not Applicable

FIELD OF THE INVENTION

The present invention relates to a loudspeaker unit, in particular for a portable device and/or for generating sound waves in the audible wavelength spectrum, comprising an electrodynamic loudspeaker designed as a woofer. Moreover, the invention relates to a portable device comprising such a loudspeaker unit.

BACKGROUND OF THE INVENTION

EP 1 271 999 A2 describes an electrodynamic loudspeaker for a mobile device. In order to be able to design this to be as small as possible, losses must be incurred with respect to the acoustic performance of the loudspeaker. Therefore, the acoustic bandwidth necessary for an excellent sound experience cannot be represented with the aid of such a loudspeaker. On the other hand, a loudspeaker optimized with respect to performance would take up too much installation space.

Moreover, DE 10 2010 004 312 B4 describes a loudspeaker for active noise cancellation. The loudspeaker is also an electrodynamic loudspeaker. In order to be able to detect ambient noise, the loudspeaker comprises a MEMS microphone, which is decoupled from a loudspeaker diaphragm. It is disadvantageous in this case that the area of the diaphragm of the electrodynamic loudspeaker is reduced due to the MEMS microphone. As a result, the acoustic performance of the loudspeaker, which is already poor, is additionally worsened.

OBJECTS AND SUMMARY OF THE INVENTION

The object of the present invention is therefore to create a loudspeaker unit, which is distinguished by high acoustic performance and a small overall volume.

The object is achieved by means of a loudspeaker unit as well as a portable device comprising such a loudspeaker unit having the features described below.

The invention relates to a loudspeaker unit, in particular for a portable device and/or for generating sound waves in the audible wavelength spectrum. The loudspeaker unit is provided, in particular, for a smartphone, a tablet, a smart watch, smart glasses, a loudspeaker enclosure, a hearing aid, and/or headphones. The loudspeaker unit comprises an electrodynamic loudspeaker designed as a woofer. The electrodynamic loudspeaker is preferably designed in such a way that it is optimized for a low frequency range of preferably less than 2 kHz. In addition to the electrodynamic loudspeaker, the loudspeaker unit comprises a MEMS loudspeaker designed as a tweeter. The MEMS loudspeaker therefore covers a higher frequency range as compared to the electrodynamic loudspeaker. The frequency ranges of the electrodynamic loudspeaker and of the MEMS loudspeaker can overlap in this case. The MEMS loudspeaker is preferably optimized for a frequency range of more than 2 kHz. The loudspeaker unit therefore preferably has a total acoustic bandwidth from 200 Hz up to 30 kHz. Advantageously, the electrodynamic loudspeaker can therefore be designed to be highly compact, since it only needs to be designed to be optimized for the low frequencies. The additional MEMS loudspeaker, which is distinguished by a highly compact overall volume, is utilized for the high frequencies. Consequently, a loudspeaker unit can be created, which has a very small overall volume. In addition, this loudspeaker unit is distinguished by a very good sound quality, since the low frequencies, in particular in a range from 200 Hz to 2 kHz, are covered by the electrodynamic loudspeaker, and the high frequencies, in particular from 2 kHz to 30 kHz, are covered by the MEMS loudspeaker. The loudspeaker unit is therefore suitable, in particular, for use in portable devices that must be designed to be as compact and lightweight as possible.

It is advantageous when the MEMS loudspeaker has been integrated into the electrodynamic loudspeaker. As a result, the loudspeaker unit can be designed to be highly compact. Moreover, the MEMS loudspeaker, together with the electrodynamic loudspeaker, forms a one-piece component, which can be integrated into a portable device very easily and, therefore, cost-effectively and quickly.

In order to be able to design the loudspeaker unit to be as compact as possible, it is advantageous when the two loudspeakers, i.e., the MEMS loudspeaker and the electrodynamic loudspeaker, share the same diaphragm. The diaphragm is therefore a component of the electrodynamic loudspeaker as well as of the MEMS loudspeaker. The diaphragm is therefore activated by the electrodynamic loudspeaker as well as by the MEMS loudspeaker. In this case, the diaphragm can be activated in the same region by the two loudspeakers. Alternatively, the loudspeakers can also activate different regions of the diaphragm. The activation of the two loudspeakers can take place sequentially. Therefore, the diaphragm can be activated in a first time window by the electrodynamic loudspeaker and in a second time window by the MEMS loudspeaker. Alternatively, it is also conceivable that the diaphragm is activated by the electrodynamic loudspeaker and by the MEMS loudspeaker at the same time.

It is advantageous when the electrodynamic loudspeaker comprises an electrodynamic first actuator unit. Preferably, the first actuator unit comprises a magnet. The magnet is arranged in the loudspeaker unit, in particular in a stationary manner. Moreover, the magnet preferably forms a pole core and/or an annular element surrounding the pole core. The magnet is preferably a permanent magnet. Additionally or alternatively, the first actuator unit comprises at least one pole plate. The pole plate is preferably designed to be planar and/or U-shaped. In an advantageous enhanced embodiment of the invention, the first actuator unit comprises a first pole plate, which is arranged on a side of the magnet facing the diaphragm, and/or a second pole plate, which is preferably arranged on a side of the magnet facing away from the diaphragm. The second pole plate is designed, in particular, to be U-shaped. In the case of a second pole plate designed to be U-shaped, the first actuator unit preferably does not comprise an annular element. In this case, the magnet forms, in particular, the pole core. Additionally or alternatively, the first actuator unit comprises a moving coil. The moving coil is movable, in particular with respect to the magnet, along a diaphragm deflection axis. During the energization of the moving coil, the moving coil is displaced along the diaphragm deflection axis due to a Coriolis force generated as a result of the energization of the moving coil. With the aid of the electrodynamic first actuator unit, the diaphragm can be activated very well in order to form the low frequency range of the loudspeaker unit.

In an advantageous enhanced embodiment of the invention, the MEMS loudspeaker comprises a piezoelectric second actuator unit. The second actuator unit preferably comprises a support substrate. Additionally or alternatively, the second actuator unit comprises at least one piezoelectric actuator. The piezoelectric actuator is connected to the support substrate. The support substrate is therefore utilized for holding the piezoelectric actuator at an end facing the support substrate. Additionally or alternatively, the piezoelectric actuator comprises a free end, which is deflectable with respect to the support substrate in the direction of the diaphragm deflection axis. The piezoelectric actuator is therefore designed, in particular, as a cantilever arm. The piezoelectric actuator is therefore anchored on the support substrate via its end facing the support substrate. The facing-away, free end of the piezoelectric actuator can therefore be moved with respect to the support substrate in the direction of the diaphragm deflection axis when the piezoelectric actuator is energized.

It is advantageous when the diaphragm is suspended, in its edge region, in a loudspeaker housing. In this case, the loudspeaker housing is preferably formed, at least partially, from a plastic, in particular a plastic ring. Parts of the loudspeaker housing can be formed, in particular, by a circuit board and/or a pole plate, in particular by the second pole plate. The second actuator unit and/or at least the moving coil are/is accommodated in the loudspeaker housing in a protective manner.

It is advantageous when the diaphragm comprises a first deflection region. The first deflection region is directly and/or indirectly coupled to the first and/or the second actuator unit in such a way that it is deflectable and/or activatable by the first and/or the second actuator unit. The first deflection region is therefore deflectable with respect to the loudspeaker housing in the direction of the diaphragm deflection axis.

Preferably, the diaphragm is made of an elastic material, in particular silicone. In order to be able to avoid damage to the diaphragm, it is advantageous when the diaphragm comprises a reinforcing element, in particular a reinforcing plate. The reinforcing plate is preferably arranged in the first deflection region. In particular, the reinforcing element extends across at least a portion of the first deflection region, preferably across the entire first deflection region.

In an advantageous enhanced embodiment of the invention, the second actuator unit is connected to the moving coil. The connection is preferably designed in such a way that, upon activation of the moving coil, the second actuator unit is movable together with the moving coil along the diaphragm deflection axis. The second actuator unit and the moving coil therefore form a unit, which is movable with respect to the magnet of the electrodynamic loudspeaker in the direction of the diaphragm deflection axis. The second actuator unit is preferably connected in the region of its support substrate to the moving coil. Consequently, the at least one piezoelectric actuator, in particular its free end, can be deflected with respect to the support substrate and the moving coil.

In order to be able to design the loudspeaker unit to be as compact as possible, it is advantageous when the second actuator unit is arranged coaxially with the first actuator unit, in particular with respect to the diaphragm deflection axis. Additionally or alternatively, it is advantageous in this regard when the second actuator unit is arranged between the first actuator unit and the diaphragm with respect to the diaphragm deflection axis. The moving coil is therefore indirectly connected to the diaphragm via the second actuator unit.

It is advantageous when the at least one piezoelectric actuator is connected in a first connection region, in particular directly or indirectly, to the first deflection region. The piezoelectric actuator, which is preferably a multilayer, piezoelectric structure, can be connected in the first connection region directly, in particular over the entire surface, to the diaphragm. Alternatively, the piezoelectric actuator, which is preferably a multilayer, piezoelectric structure, can be indirectly connected in the first connection region to the diaphragm. In this case, it is advantageous when the at least one piezoelectric actuator is spaced apart from the diaphragm in the direction of the diaphragm deflection axis. Additionally or alternatively, the piezoelectric actuator is indirectly connected, in the first connection region comprising its free end, to the first deflection region of the diaphragm via a coupling element. The coupling element is therefore a spacer in the direction of the diaphragm deflection axis between the piezoelectric actuator and the diaphragm. The coupling element can be designed as one piece. In this case, the coupling element is made of the same material as the support substrate, due to manufacturing-related reasons. Moreover, the support substrate and the coupling element have the same thickness with respect to one another in the direction of the diaphragm deflection axis. Alternatively, the coupling element can also be designed to comprise multiple parts, however. One part can be made of the same material as the support substrate and a second part can be mounted, in particular adhesively bonded, onto this first part. The second part can be made of another material, in particular a plastic, as compared to the first part.

In an advantageous enhanced embodiment of the invention, the moving coil is indirectly connected, in the first connection region, to the first deflection region of the diaphragm via the at least one piezoelectric actuator. A deflection movement of the moving coil is therefore indirectly transmitted via the at least one piezoelectric actuator to the diaphragm, in particular in its first deflection region. Additionally or alternatively, the moving coil is flexibly connected to the first deflection region of the diaphragm via the at least one piezoelectric actuator.

In particular when the diaphragm is to be activated over the entire surface by both actuator units, it is advantageous when the moving coil is exclusively indirectly connected to the first deflection region of the diaphragm via the at least one piezoelectric actuator and/or flexibly in the first connection region. "Exclusively" means that the first actuator unit can therefore exclusively indirectly activate the diaphragm via the second actuator unit. There is no additional connection region between the first actuator unit and the diaphragm, via which the diaphragm could be directly activated. Advantageously, the diaphragm can therefore be utilized over its entire surface by the first actuator unit as well as by the second actuator unit.

It is advantageous when the loudspeaker unit comprises a flexible centering spider, in order to be able to center the diaphragm in a non-deflected neutral position. Preferably, the moving coil and/or the second actuator unit are/is connected to the centering spider. Additionally or alternatively, the moving coil and/or the second actuator unit are/is suspended with the aid of the centering spider with respect to the loudspeaker housing so as to be deflectable in the direction of the diaphragm deflection axis. The centering spider is preferably designed to be current-conducting, so that the moving coil and/or the second actuator unit can be activated.

In an advantageous enhanced embodiment of the invention, the flexible centering spider is formed by a flexible circuit board. The flexible circuit board is made, in particular, of a flexible polymer. Moreover, it is advantageous when the flexible circuit board comprises woven elastic contact paths, in particular made of woven carbon fibers or woven metal bands. Moreover, it is advantageous when the flexible circuit board comprises a contact region in which the flexible circuit board can be electrically connected to a hard circuit board, to the moving coil, and/or to the at least one piezoelectric actuator.

In an advantageous enhanced embodiment of the invention, the diaphragm comprises a second deflection region. The second deflection region is also deflectable with respect to the loudspeaker housing in the direction of the diaphragm deflection axis. Moreover, the diaphragm is connected, in its second deflection region, in particular indirectly via the support substrate of the second actuator unit, to the first actuator unit, in particular to the moving coil, in such a way that the second deflection region is activatable by the first actuator unit.

In this regard, it is advantageous when the moving coil is connected, in a second connection region, to the second deflection region of the diaphragm. The moving coil is preferably indirectly connected, via the support substrate of the second actuator unit, to the second deflection region of the diaphragm. The connection between the moving coil and the second deflection region is preferably designed to be rigid in the second connection region. Consequently, a deflection movement of the moving coil is transmitted to the second deflection region of the diaphragm directly, i.e., without a flexible element connected therebetween. The moving coil is preferably also connected, in the second connection region, to the second deflection region of the diaphragm in addition to the first connection region in which the moving coil is indirectly connected via the at least one flexible piezoelectric actuator. As mentioned above, the connection in the second connection region is preferably designed to be rigid, so that the movement of the moving coil is transmitted to the second deflection region of the diaphragm directly, i.e., without a distortion of the movement. Advantageously, the first deflection region can therefore be activated by the second actuator unit and the second deflection region can be activated by the first actuator unit.

It is also advantageous when the diaphragm comprises a flexible first loudspeaker corrugation associated with the first deflection region and/or a flexible second loudspeaker corrugation associated with the second deflection region. The first loudspeaker corrugation therefore enables the first deflection region to oscillate in the direction of the diaphragm deflection axis. The second loudspeaker corrugation therefore enables the second deflection region to oscillate in the direction of the diaphragm deflection axis. Consequently, the diaphragm comprises two deflection regions, each of which can be activated by one of the two actuator units.

In this regard, it is advantageous, in particular, when the second connection region is arranged between the two loudspeaker corrugations. Advantageously, the second deflection region therefore comprises the first deflection region, the first loudspeaker corrugation, and/or the second connection region.

In an advantageous enhanced embodiment of the invention, the MEMS loudspeaker is separated from the electrodynamic loudspeaker. The MEMS loudspeaker and the electrodynamic loudspeaker are therefore not located in a common loudspeaker housing. Instead, the MEMS loudspeaker and the electrodynamic loudspeaker are two separate components. The MEMS loudspeaker and the electrodynamic loudspeaker separated therefrom are preferably arranged separately from one another in a common housing.

In this regard, it is advantageous when the MEMS loudspeaker and the electrodynamic loudspeaker separated therefrom comprise a common resonant cavity or each comprise a separate resonant cavity. Additionally or alternatively, it is advantageous when the MEMS loudspeaker and the electrodynamic loudspeaker comprise a common sound conduction cavity or each comprise a separate sound conduction cavity. In the case of a common sound conduction cavity, it is advantageous when the MEMS loudspeaker and the electrodynamic loudspeaker separated therefrom comprise a common sound outlet. Alternatively, the MEMS loudspeaker and the electrodynamic loudspeaker can also comprise a separate sound outlet, however.

The invention relates to a portable device comprising a loudspeaker unit. The portable device can be, in particular, a smart device, such as a smartphone, a smart watch and/or smart glasses, a tablet, a loudspeaker enclosure, a hearing aid, and/or headphones. The loudspeaker unit is designed according to the preceding description, wherein the mentioned features can be present individually or in any combination. As a result, a portable device can be designed, which has very good acoustic performance and, in addition, can be designed to be very lightweight and compact.

BRIEF DESCRIPTION OF THE DRAWINGS

Further advantages of the invention are described in the following exemplary embodiments. Wherein.

DETAILED DESCRIPTION OF EXEMPLARY EMBODIMENTS

FIGS. 1a, 1b, 2, and 3 show different exemplary embodiments of a loudspeaker unit 1 comprising an electrodynamic loudspeaker 2 and a MEMS loudspeaker 3 integrated therein. FIGS. 4a, 4b, 5a, and 5b show two different exemplary embodiments of a loudspeaker unit 1, which also comprise an electrodynamic loudspeaker 2 and a MEMS loudspeaker 3, wherein, in contrast to the exemplary embodiment represented in FIGS. 1a, 1b, 2, and 3, these are not integrated, but rather are separated from one another. In the exemplary embodiments described in the following, the electrodynamic loudspeaker 2 is preferably designed as a woofer and the MEMS loudspeaker is designed as a tweeter.

Figure 1A:
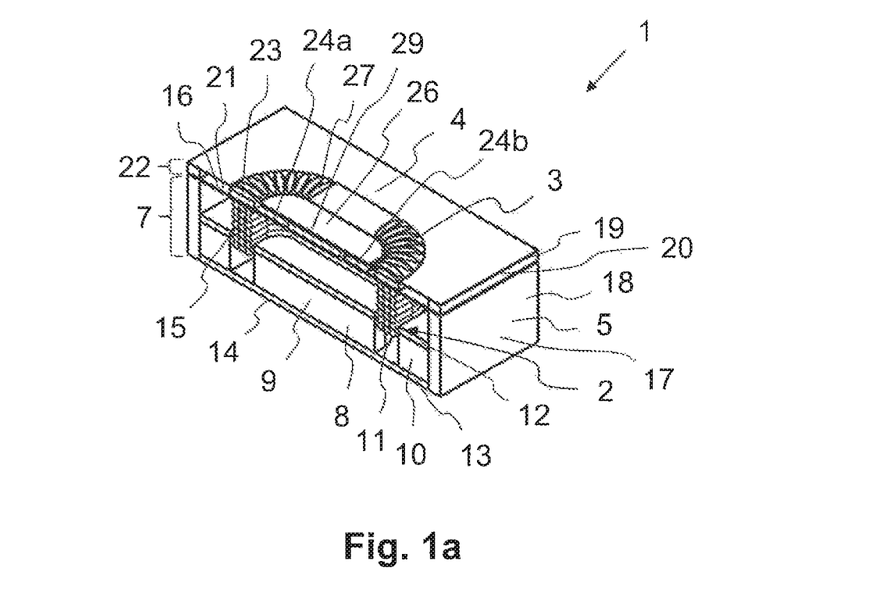
FIGS. 1a, 1b show a loudspeaker unit comprising an electrodynamic loudspeaker and a MEMS loudspeaker integrated into the electrodynamic loudspeaker according to a first exemplary embodiment.
Figure 1B:
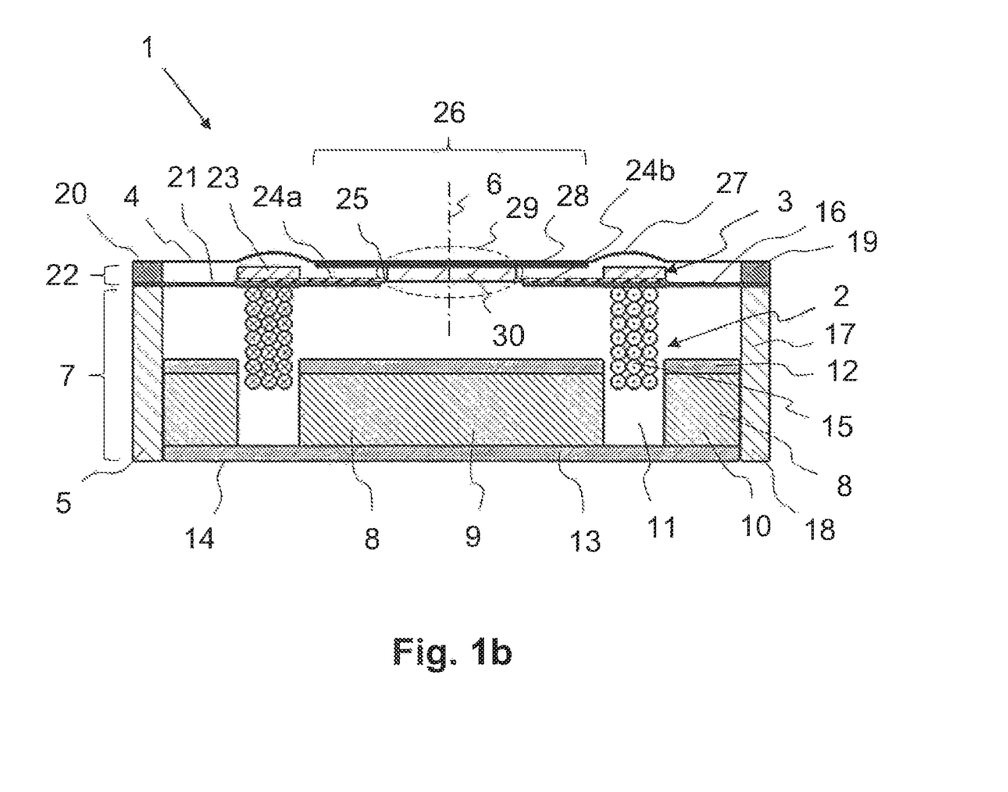

FIGS. 1*a* and 1*b* show a first exemplary embodiment of a loudspeaker unit 1, which comprises an electrodynamic loudspeaker 2 and a MEMS loudspeaker 3. The electrodynamic loudspeaker 2 and the MEMS loudspeaker 3 have been integrated into one another. The electrodynamic loudspeaker 2 is designed as a woofer. Consequently, it covers, in particular, a frequency range from 200 Hz to 2 kHz. The MEMS loudspeaker 3 is designed as a tweeter. It therefore preferably covers a frequency range from 2 kHz to 30 kHz. With the aid of the electrodynamic loudspeaker 2 designed as a woofer and the MEMS loudspeaker 3 designed as a tweeter, a highly compact loudspeaker unit 1 can therefore be created, which covers a broad frequency spectrum and, consequently, has a very high sound quality. The loudspeaker unit 1 can be designed to be highly compact and space-saving, in particular due to the MEMS loudspeaker 3 responsible for the high-frequency range. The particular electrodynamic loudspeaker 2 is designed as a woofer and the MEMS loudspeaker 3 is designed as a tweeter in the following exemplary embodiments as well.

In the exemplary embodiment represented in FIG. 1*a* in a perspective sectional view and in FIG. 1*b* in a cross-sectional view, the loudspeaker unit 1 comprises a diaphragm 4. Moreover, the loudspeaker unit 1 comprises a loudspeaker housing 5. The diaphragm 4, via its edge region, is fastened to the loudspeaker housing 5 or is suspended therein. The diaphragm 4 can therefore be deflected along a diaphragm deflection axis 6 according to FIG. 1*b*. In the present integrative loudspeaker unit 1, the two loudspeakers, i.e., the electrodynamic loudspeaker 2 and the MEMS loudspeaker 3, share the same diaphragm 4. The diaphragm 4 is therefore a component of the electrodynamic loudspeaker 2 as well as of the MEMS loudspeaker 3.

As is apparent, in particular, from FIG. 1*b*, the electrodynamic loudspeaker 2 comprises a first actuator unit 7. This first actuator unit 7 comprises a magnet 8 according to the exemplary embodiment represented in FIGS. 1*a* and 1*b*. The magnet 8 forms a pole core 9. Moreover, the magnet 8 forms an annular element 10. The annular element 10 surrounds the pole core 9. In addition, the first actuator unit 7 comprises an air gap 11. This air gap 11 is designed to be annular in the present case. According to FIG. 1*b*, the air gap 11 is located between the pole core 9 and the radially outer annular element 10. The magnet 8 comprises a first pole plate 12 on its side facing the diaphragm 4. The magnet 8 comprises a second pole plate 13 on its side facing away from the diaphragm 4. The first pole plate 12 is designed to be planar. Moreover, the first pole plate 12 is interrupted by the air gap 11 according to FIG. 1*b*. In contrast thereto, the second pole plate 13 is designed to be continuous. Moreover, the second pole plate 13 forms a housing base 14 of the loudspeaker housing 5.

As is apparent from FIGS. 1*a* and 1*b*, the first actuator unit 7 further comprises a moving coil 15. The moving coil 15 is movably suspended in the air gap 11. Upon energization of the moving coil 15, the moving coil 15 is moved in the direction of the diaphragm deflection axis 6 depending on a Coriolis force.

According to FIG. 1*b*, the loudspeaker unit 1 comprises a centering spider 16. The centering spider 16 is designed to be flexible. The centering spider 16 is fastened, in its edge region, to the loudspeaker housing 5. A side wall 17 of the loudspeaker housing 5 is formed from a first housing part 18 and a second housing part 19 in the present case. The centering spider 16 is fastened, in particular clamped and/or adhered, between the first housing part 18 and the second housing part 19. The first housing part 18 is preferably designed as a plastic part. According to the exemplary embodiment represented in FIGS. 1*a* and 1*b*, the second housing part 19 is a hard circuit board 20. The centering spider 16 is designed as a flexible circuit board 21 in the present case. The flexible circuit board 21 can therefore be deflected along the diaphragm deflection axis 6 and is utilized for centering the diaphragm 4 in a non-deflected neutral position. The flexible circuit board 21 is electrically conductively connected to the hard circuit board 20.

In addition to the first actuator unit 7, the loudspeaker unit 1 also comprises a second actuator unit 22. This second actuator unit 22 is associated with the MEMS loudspeaker 3. According to FIG. 1*b*, the second actuator unit 22 comprises a support substrate 23. The support substrate is preferably made of silicon. Moreover, the second actuator unit 22 comprises at least one piezoelectric actuator 24*a*, 24*b*. In this case, this is preferably a multilayer actuator structure comprising at least one electrode layer and at least one piezoelectric layer. The piezoelectric actuator 24*a*, 24*b* is designed as a cantilever arm in the present case. Consequently, the piezoelectric actuator 24*a*, 24*b* is connected, at its one end, to the support substrate 23. The support substrate 23 is preferably designed as a frame. Moreover, the piezoelectric actuator 24*a*, 24*b* comprises a free end 25 facing away from the support substrate 23. Upon an electrical activation of the piezoelectric actuator 24*a*, 24*b*, its free end 25 can be deflected with respect to the support substrate 23 in the direction of the diaphragm deflection axis 6. According to the exemplary embodiment represented in FIGS. 1*a* and 1*b*, the second actuator unit 22 comprises two such piezoelectric actuators 24*a*, 24*b*. The piezoelectric actuators 24*a*, 24*b* are arranged opposite one another.

As is apparent from FIG. 1*b* in particular, the moving coil 15 is fastened to the centering spider 16 or is suspended via the centering spider 16 so as to be deflectable along the diaphragm deflection axis 6. The moving coil 15 is fastened on a side of the centering spider 16 facing the magnet 8. Moreover, the moving coil 15 is electrically connected to the hard circuit board 20 via the centering spider 16, which is designed as a flexible circuit board 21, as mentioned above. The hard circuit board 20 preferably comprises a controller, in particular an ASIC.

Moreover, the second actuator unit 22 is connected to the centering spider 16 and/or is supported by the centering spider 16. According to the present exemplary embodiment, the second actuator unit 22 is arranged on a side of the centering spider 16 facing the diaphragm 4 and is connected, in particular adhered, thereto. The piezoelectric actuator 24*a*, 24*b* is electrically conductively connected to the hard circuit board 20 via the centering spider 16 designed as a flexible circuit board 21. Consequently, the piezoelectric actuator 24*a*, 24*b* as well as the moving coil 15 can be activated, via the flexible circuit board 21, by a control unit, which is not represented in the present case and is preferably arranged in the hard circuit board 20.

According to FIGS. 1*a* and 1*b*, the diaphragm 4 comprises a first deflection region 26. A flexible first loudspeaker corrugation 27 is associated with this first deflection region 26. The first loudspeaker corrugation 27 surrounds the first deflection region 26, so that the deflection region 26 can be deflected along the diaphragm deflection axis 6. In the first deflection region 26, the diaphragm 4 comprises a reinforcing element 28. The reinforcing element 28 is fastened to an inner side or to a side of the diaphragm 4 facing the second actuator unit 22.

As is apparent from FIG. 1b in particular, the loudspeaker unit 1 comprises a first connection region 29 in which the second actuator unit 22 is coupled to the diaphragm 4. In the present case, the piezoelectric actuators 24a, 24b are indirectly connected, in the first connection region 29, to the diaphragm 4 via a coupling element 30. The two piezoelectric actuators 24a, 24b are connected to the coupling element 30 in the region of their particular free end 25. The coupling element 30, in turn, is fastened to the diaphragm 4 in the first deflection region 26, in particular to the reinforcing element 28. Due to the coupling element 30, the piezoelectric actuators 24a, 24b are spaced apart from the diaphragm 4 in the direction of the diaphragm deflection axis 6. According to the present exemplary embodiment, the coupling element 30 is made of the same material as the support substrate 23. Moreover, the support substrate 23 and the coupling element 30 have the same height, due to production-related reasons.

Via the first connection region 29, the diaphragm 4 can therefore be activated, in its first deflection region 26, by the piezoelectric second actuator unit 22. In addition, according to the present exemplary embodiment, the diaphragm 4 can also be activated, in its first deflection region 26, via the moving coil 15. A movement of the moving coil 15 is therefore indirectly transmitted to the diaphragm 4 in the first deflection region 26 via the piezoelectric actuators 24a, 24b and/or via the coupling element 30. The second actuator unit 22 is decoupled from the diaphragm 4 in the region of the support substrate 23. During the movement of the moving coil 15, the first deflection region 26 of the diaphragm 4 is therefore deflected. A second movement, which is transmitted via the at least one piezoelectric actuator 24a, 24b to the diaphragm 4, namely to the first deflection region 26, can be superimposed on this movement initiated by the moving coil 15.

As mentioned above, the second actuator unit 22 is coupled to the moving coil in the region of the support substrate 23. Consequently, during a deflection of the moving coil 15, the second actuator unit 22 is also moved together with the moving coil 15 along the diaphragm deflection axis 6. The moving coil 15 is therefore indirectly connected to the first deflection region 26 of the diaphragm 4 via the second actuator unit 22.

In order to be able to design the loudspeaker unit 1 to be as space-saving as possible, the second actuator unit 22 is arranged coaxially with the first actuator unit 7. Moreover, the second actuator unit 22 is located between the first actuator unit 7 and the diaphragm 4 with respect to the diaphragm deflection axis 6. The second actuator unit 22 is therefore arranged downstream from the first actuator unit 7. Consequently, given an active first actuator unit 7 and an active second actuator unit 22, a superposed overall movement of the first deflection region 26 of the diaphragm 4 results, which is composed of a first diaphragm movement caused by the first actuator unit 7 and a second diaphragm movement cause by the second actuator unit 22.

Figure 2:
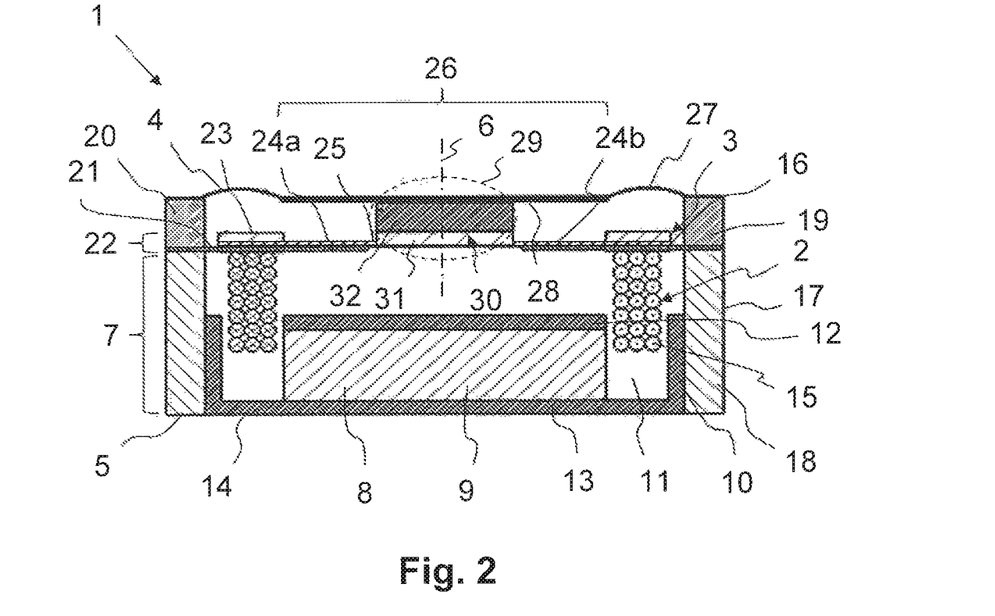
FIG. 2 shows a sectional representation of a loudspeaker unit comprising an electrodynamic loudspeaker and a MEMS loudspeaker integrated therein according to a second exemplary embodiment.
Figure 3:
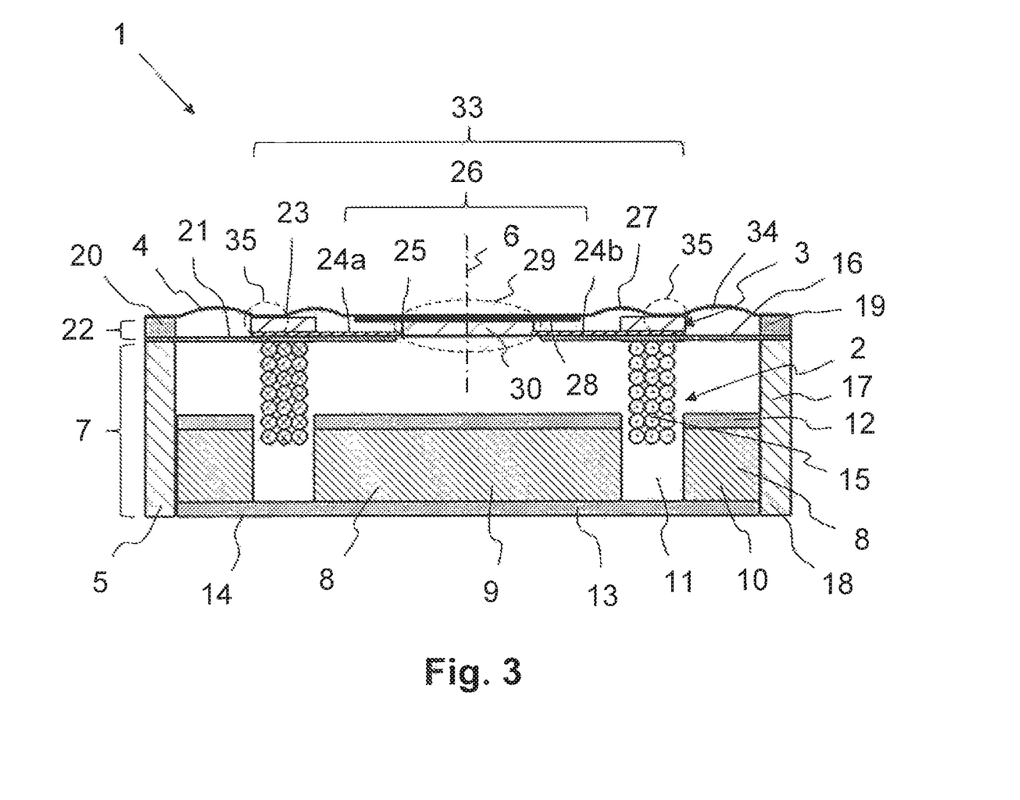
FIG. 3 shows a sectional representation of a loudspeaker unit comprising an electrodynamic loudspeaker and a MEMS loudspeaker integrated therein according to a third exemplary embodiment.

In the description of the exemplary embodiments represented in FIGS. 2 and 3, identical reference numerals are utilized for features that are identical or at least comparable in terms of their design and/or mode of operation as compared to the first exemplary embodiment represented in FIGS. 1a and 1b. Provided these features are not explained in detail once again, their design and mode of operation correspond to the design and mode of operation of the features already described above. Consequently, essentially the differences will be described with respect to the exemplary embodiments represented in FIGS. 2 and 3.

With respect to the exemplary embodiment represented in FIG. 2, the coupling element is designed to be multiple-part, comprising a first coupling part 31 and a second coupling part 32. The first coupling part 31 is made of the same material as the support substrate 23 in this case. The second coupling part 32 is preferably made of a different material, in particular a plastic. As a result, the distance between the diaphragm 4 and the piezoelectric actuators 24a, 24b in the direction of the diaphragm deflection axis 6 can be increased. Advantageously, the diaphragm 4 can therefore be deflected across a greater path length.

Moreover, the first actuator unit 7 according to the exemplary embodiment represented in FIG. 2 does not comprise an annular element 10 formed by the magnet 8. The magnet 8 therefore exclusively forms the pole core 9. Instead, the second pole plate 13 is designed to be U-shaped. The air gap 11 is therefore formed between the U-legs of the second pole plate 13 and the magnet 8. Consequently, the U-legs of the second pole plate 13 form the annular element 10.

FIG. 3 shows a third exemplary embodiment of the loudspeaker unit 1. In this case, the first actuator unit 7 is designed as in the first exemplary embodiment represented in FIGS. 1a and 1b. Alternatively, the first actuator unit 7 could also be designed as in the exemplary embodiment represented in FIG. 2. The same applies for the coupling element 30.

In contrast to the exemplary embodiment represented in FIGS. 1a and 1b, the diaphragm 4 in the exemplary embodiment represented in FIG. 3 comprises a second deflection region 33. A second loudspeaker corrugation 34 is associated with the second deflection region 33. The second loudspeaker corrugation 34 surrounds the second deflection region 33. Due to the flexible design of the second loudspeaker corrugation 34, the second deflection region 33 can therefore be deflected with respect to the loudspeaker housing 5 along the diaphragm deflection axis 6. As is apparent from FIG. 3, the first deflection region 26 is arranged within the second deflection region 33.

In addition to the first connection region 29, the loudspeaker unit 1 according to the exemplary embodiment represented in FIG. 3 also comprises a second connection region 35. The second connection region 35 is arranged within the second deflection region 33 and/or is designed as a closed ring. In this second connection region 35, the moving coil 15 is connected to the second deflection region 33 of the diaphragm 4. The connection between the moving coil 15 and the second deflection region 33 takes place, in this case, indirectly via the support substrate 23 arranged therebetween. The diaphragm 4 is fastened, in particular adhered, on its underside or on its side facing the support substrate 23, to the support substrate 23 in the second connection region 35.

The second deflection region 33 therefore comprises, as viewed from the inside toward the outside, the first deflection region 26, the first loudspeaker corrugation 27, and/or the second connection region 35. Upon activation of the moving coil 15, the moving coil movement is therefore transmitted to the diaphragm 4 via the second connection region 35, so that the second deflection region 33, which is located within the second loudspeaker corrugation 34, is deflected along the diaphragm deflection axis 6.

The first deflection region 26 located within the first loudspeaker corrugation 27 can now be additionally deflected via the at least one piezoelectric actuator 24a, 24b. The deflection movement of the moving coil 15 and the deflection movement of the at least one piezoelectric actuator 24a, 24b are therefore decoupled from one another or are associated with two different deflection regions 26, 33.

According to FIG. 3, the moving coil 15 and the second actuator unit 22 are spaced apart from the side wall 17. This distance preferably corresponds to the width of the second loudspeaker corrugation 34.

Figure 4A:
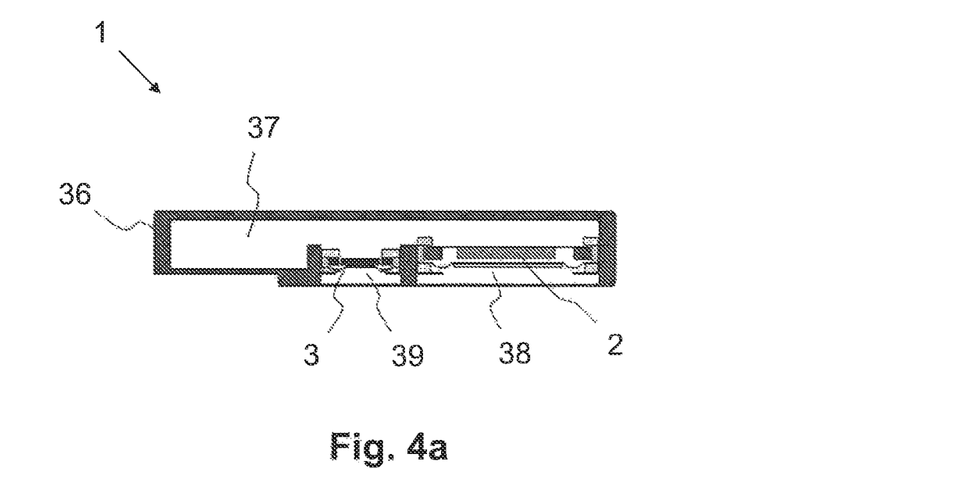
FIGS. 4a, 4b show a loudspeaker unit comprising an electrodynamic loudspeaker and a MEMS loudspeaker separated therefrom according to a first exemplary embodiment.
Figure 4B:
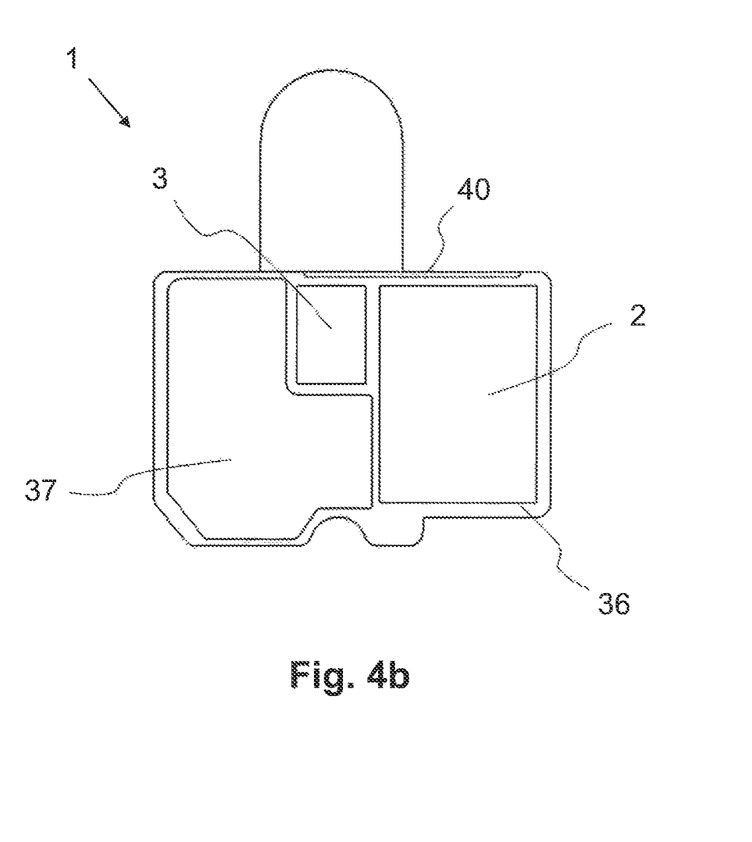

FIGS. 4a and 4b show an exemplary embodiment of the loudspeaker unit 1, in which the MEMS loudspeaker 3 is separated from the electrodynamic loudspeaker 2. FIG. 4a shows a cross-sectional view of the loudspeaker unit 1. FIG. 4b shows a top view of the loudspeaker unit 1. The MEMS loudspeaker 3 and the electrodynamic loudspeaker 2 are arranged in a housing 36, separated from one another. As is apparent from FIG. 4a, in particular, the housing 36 comprises a resonant cavity 37. This is a common resonant cavity 37 in this case, which is shared by the electrodynamic loudspeaker 2 and the MEMS loudspeaker 3. Moreover, the electrodynamic loudspeaker 2 comprises a first sound conduction cavity 38 and the MEMS loudspeaker 3 comprises a second sound conduction cavity 39. The two sound conduction cavities 38, 39 combine to form one common sound conduction cavity. Consequently, the two sound conduction cavities 38, 39 comprise a common sound outlet 40 according to FIG. 4b. Alternatively, the two sound conduction cavities 38, 39 can also comprise two sound outlets separated from one another.

Figure 5A:
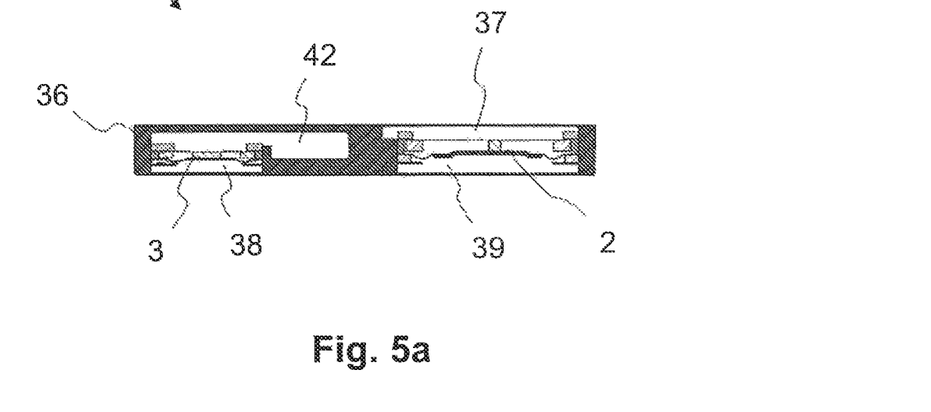
FIGS. 5a, 5b show a loudspeaker unit comprising an electrodynamic loudspeaker and a MEMS loudspeaker separated therefrom according to a second exemplary embodiment.
Figure 5B:
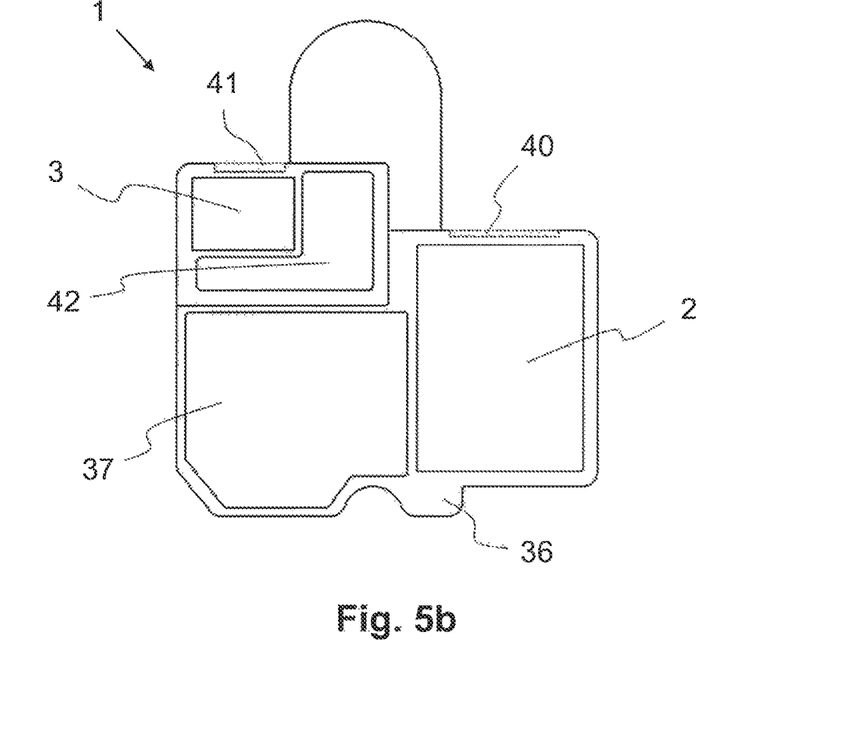

A loudspeaker unit 1 is also represented in the exemplary embodiment represented in FIGS. 5a and 5b, which comprises an electrodynamic loudspeaker 2 and a MEMS loudspeaker 3 separated therefrom. In contrast to the exemplary embodiment represented in FIGS. 4a and 4b, the electrodynamic loudspeaker 2 comprises a first resonant cavity 37 and the MEMS loudspeaker 3 comprises a second resonant cavity 42 separated therefrom. Moreover, these each comprise a sound conduction cavity 38, 39, which are separated from one another. A separate sound outlet 40, 41 is therefore associated with each of these sound conduction cavities 38, 39 according to FIG. 5b.

In an exemplary embodiment not represented in the present case, at least one of the loudspeakers represented in the exemplary embodiments according to FIGS. 4a, 4b and/or 5a, 5b, i.e., the electrodynamic loudspeaker 2 and/or the MEMS loudspeaker 3 separated therefrom, can be designed according to an exemplary embodiment represented in FIG. 1a, 1b, 2, and/or 3. Consequently, the first loudspeaker 2 and/or the second loudspeaker 3 in the exemplary embodiments represented in FIGS. 4a, 4b and/or 5a, 5b can be designed as the loudspeaker unit 1 represented in FIGS. 1a, 1b, 2, and/or 3, i.e., as an integral loudspeaker comprising an electrodynamic loudspeaker 2 and a MEMS loudspeaker 3 integrated therein.

The above-described loudspeaker units 1 are provided for portable devices, such as mobile phones, tablets, smartphones, smart glasses, loudspeaker enclosures, hearing aids, and/or headphones.

The present invention is not limited to the represented and described exemplary embodiments. Modifications within the scope of the claims are also possible, as is any combination of the features, even if they are represented and described in different exemplary embodiments.

LIST OF REFERENCE NUMBERS 1 loudspeaker unit
2 electrodynamic loudspeaker
3 MEMS loudspeaker
4 diaphragm
5 loudspeaker housing
6 diaphragm deflection axis
7 first actuator unit
8 magnet
9 pole core
10 annular element
11 air gap
12 first pole plate
13 second pole plate
14 housing base
15 moving coil
16 centering spider
17 side wall
18 first housing part
19 second housing part
20 hard circuit board
21 flexible circuit board
22 second actuator unit
23 support substrate
24 piezoelectric actuator
25 free end
26 first deflection region
27 first loudspeaker corrugation
28 reinforcing element
29 first connection region
30 coupling element
31 first coupling part
32 second coupling part
33 second deflection region
34 second loudspeaker corrugation
35 second connection region
36 housing
37 first resonant cavity
38 first sound conduction cavity
39 second sound conduction cavity
40 first sound outlet
41 second sound outlet
42 second resonant cavity

The invention claimed is:

1. A loudspeaker unit for a portable device, the loudspeaker unit comprising:
   a loudspeaker housing;
   an electrodynamic loudspeaker designed as a woofer and disposed in the loudspeaker housing;
   a MEMS loudspeaker integrated into the electrodynamic loudspeaker and designed as a tweeter;
   a diaphragm shared by the electrodynamic loudspeaker and the MEMS loudspeaker and defining an edge region that is suspended in the loudspeaker housing, wherein the diaphragm further defines a first deflection region that includes a stiffening plate;
   a coupling element connected to the diaphragm in the first deflection region;
   wherein the electrodynamic loudspeaker includes an electrodynamic first actuator unit that includes a moving coil that is configured to be deflectable along a diaphragm deflection axis when electrically energized;
   wherein the MEMS loudspeaker that is integrated into the electrodynamic loudspeaker includes a piezoelectric second actuator unit;
   wherein the first deflection region is deflectable by the piezoelectric second actuator unit with respect to the loudspeaker housing in the direction of the diaphragm deflection axis, and wherein the piezoelectric second actuator unit and the diaphragm are connected to each other via the coupling element;

wherein the piezoelectric second actuator unit is connected to the moving coil so that the piezoelectric second actuator unit can be moved together with the moving coil along the diaphragm deflection axis when the moving coil is actuated;

wherein the piezoelectric second actuator unit includes a plurality of piezoelectric actuators, which are spaced apart from the diaphragm in the direction of the diaphragm deflection axis, and each of the plurality of piezoelectric actuators includes a respective cantilever with a respective free end that is connected to the coupling element so that each respective free end of the piezoelectric actuator is indirectly connected to the first deflection region of the diaphragm via the coupling element;

wherein each of the plurality of piezoelectric actuators is configured to be electrically controlled so that each of the respective free ends becomes deflected in the direction of the diaphragm deflection axis relative to the moving coil;

a flexible spider that is connected to the moving coil of the electrodynamic first actuator unit and to the piezoelectric second actuator unit; and wherein the flexible spider is a flexible circuit board.

2. A loudspeaker unit as claimed in claim 1, wherein the piezoelectric second actuator unit is arranged coaxially with the electrodynamic first actuator unit.

3. A loudspeaker unit as claimed in claim 2, wherein the piezoelectric second actuator unit is arranged between the electrodynamic first actuator unit and the diaphragm with respect to the diaphragm deflection axis.

4. A loudspeaker unit as claimed in claim 1, wherein the moving coil is connected indirectly via the plurality of piezoelectric actuators of the piezoelectric second actuator unit to the first deflection region of the diaphragm.

5. A loudspeaker unit as claimed in claim 4, wherein the moving coil is connected flexibly in the first connection region to the first deflection region of the diaphragm.

6. A loudspeaker unit as claimed in claim 1, wherein the moving coil and the piezoelectric second actuator unit are suspended from the flexible spider so as to be deflectable with respect to the loudspeaker housing in the direction of the diaphragm deflection axis.

7. A loudspeaker unit as claimed in claim 1, wherein the diaphragm comprises a second deflection region deflectable by the electrodynamic first actuator unit with respect to the loudspeaker housing in the direction of the diaphragm deflection axis, and the moving coil is connected, in a second connection region, to the second deflection region of the diaphragm.

8. A loudspeaker unit as claimed in claim 7, wherein the diaphragm comprises a flexible first loudspeaker cone associated with the first deflection region and a flexible second loudspeaker cone associated with the second deflection region, and the second connection region is arranged between the first loudspeaker cone and the second loudspeaker cone.

9. A loudspeaker unit as claimed in claim 1, wherein the piezoelectric second actuator unit includes a support substrate that is connected to each respective cantilever of the plurality of piezoelectric actuators so that each respective free end is deflectable with respect to the support substrate in the direction of the diaphragm deflection axis.

10. A portable device comprising: a loudspeaker unit, wherein the loudspeaker unit includes:
a loudspeaker housing;
an electrodynamic loudspeaker configured as a woofer and disposed in the loudspeaker housing;
a MEMS loudspeaker integrated into the electrodynamic loudspeaker and configured as a tweeter;
a diaphragm shared by the electrodynamic loudspeaker and the MEMS loudspeaker and defining an edge region that is suspended in the loudspeaker housing, wherein the diaphragm further defines a first deflection region that includes a stiffening plate;
a coupling element connected to the diaphragm in the first deflection region;
wherein the electrodynamic loudspeaker includes an electrodynamic first actuator unit that includes a moving coil that is configured to be deflectable along a diaphragm deflection axis when electrically energized;
wherein the MEMS loudspeaker that is integrated into the electrodynamic loudspeaker includes a piezoelectric second actuator unit;
wherein the first deflection region is deflectable by the piezoelectric second actuator unit with respect to the loudspeaker housing in the direction of the diaphragm deflection axis, and wherein the piezoelectric second actuator unit and the diaphragm are connected to each other via the coupling element;
wherein the piezoelectric second actuator unit is connected to the moving coil so that the piezoelectric second actuator unit can be moved together with the moving coil along the diaphragm deflection axis when the moving coil is actuated;
wherein the piezoelectric second actuator unit includes a plurality of piezoelectric actuators, which are spaced apart from the diaphragm in the direction of the diaphragm deflection axis, and each of the plurality of piezoelectric actuators includes a respective cantilever with a respective free end that is connected to the coupling element so that each respective free end of the piezoelectric actuator is indirectly connected to the first deflection region of the diaphragm via the coupling element;
wherein each of the plurality of piezoelectric actuators is configured to be electrically controlled so that each of the respective free ends becomes deflected in the direction of the diaphragm deflection axis relative to the moving coil;
wherein the loudspeaker unit comprises a flexible spider that is connected to the moving coil of the electrodynamic first actuator unit and to the piezoelectric second actuator unit; and
wherein the flexible spider is a flexible circuit board.

* * * * *